(12) United States Patent  
Harano

(10) Patent No.: US 6,475,334 B1
(45) Date of Patent: Nov. 5, 2002

(54) DRY ETCHING DEVICE AND DRY ETCHING METHOD

(75) Inventor: Hideki Harano, Tokyo (JP)

(73) Assignee: NEC Corporation, Tokyo (JP)

(*) Notice: Subject to any disclaimer, the term of this patent is extended or adjusted under 35 U.S.C. 154(b) by 94 days.

(21) Appl. No.: 09/610,987

(22) Filed: Jul. 6, 2000

(30) Foreign Application Priority Data

Jul. 6, 1999 (JP) .......................................... 11-191686

(51) Int. Cl.[7] ...................... H01L 21/306; H01L 21/302
(52) U.S. Cl. ............................ 156/345.48; 156/345.44; 156/345.38; 156/345.1; 216/68; 118/723 I; 118/723 IR
(58) Field of Search ..................... 156/345.1, 345.38, 156/345.44, 345.48; 216/68; 118/723 I, 723 IR

(56) References Cited

U.S. PATENT DOCUMENTS

| | | | |
|---|---|---|---|
| 5,401,350 A | * 3/1995 | Patrick et al. ............... | 156/345 |
| 5,537,004 A | * 7/1996 | Imahashi et al. ......... | 315/111.21 |
| 5,554,223 A | * 9/1996 | Imahashi .................. | 118/723 I |
| 5,685,942 A | * 11/1997 | Ishii ............................ | 156/345 |
| 5,688,357 A | * 11/1997 | Hanawa ....................... | 156/345 |
| 5,897,713 A | * 4/1999 | Tomioka ................... | 118/723 I |
| 6,054,013 A | * 4/2000 | Collins et al. ............... | 156/345 |
| 6,063,233 A | * 5/2000 | Collins et al. ............... | 156/345 |
| 6,077,384 A | * 6/2000 | Collins et al. ............... | 156/345 |
| 6,093,457 A | * 7/2000 | Okumura et al. ............ | 427/569 |
| 6,244,211 B1 | * 6/2001 | Nishikawa et al. ... | 118/723 AN |
| 6,280,563 B1 | * 8/2001 | Baldwin, Jr. et al. ........ | 156/345 |
| 6,308,654 B1 | * 10/2001 | Schneider et al. ........ | 118/723 I |

FOREIGN PATENT DOCUMENTS

| | | |
|---|---|---|
| JP | 64-57600 | 3/1989 |
| JP | 6-196445 | 9/1994 |
| JP | 7-74115 | 3/1995 |
| JP | 9-82494 | 3/1997 |
| JP | 9-97786 | 4/1997 |
| JP | 9-237698 | 9/1997 |
| JP | 07-090632 | 10/1997 |
| JP | 10-510389 | 10/1998 |
| JP | 10-321399 | 12/1998 |
| JP | 11-97422 | 4/1999 |

OTHER PUBLICATIONS

Japanese Office Action dated Jan. 24, 2002, with partial English translation.

* cited by examiner

Primary Examiner—George Goudreau
(74) Attorney, Agent, or Firm—McGinn & Gibb, PLLC

(57) ABSTRACT

An inductively coupled plasma dry etching device includes etching chamber 10 and ceramic dome 20. Etching chamber 10 is provided with gate 11 and gas injection port 12. Ceramic ESC stage 31 is provided inside etching chamber 10, and outside etching chamber 10, pressure gauge 13 and pressure controller 40 are connected, and high-frequency power supply 23 is connected to ESC stage 31. First coil 21 and second coil 22 are arranged in helical form on the outside of dome 20 such that turns of one coil lie between turns of the other coil, first coil 21 being connected to second high-frequency power supply 24 and second coil 22 being connected to third high-frequency power supply 25. The high-frequency power supplies are switched at a prescribed time interval.

3 Claims, 3 Drawing Sheets

DRY ETCHING DEVICE AND DRY ETCHING METHOD

BACKGROUND OF THE INVENTION

1. Field of the Invention

The present invention relates to a dry etching device and dry etching method, and particularly to an inductively coupled plasma dry etching device and dry etching method.

2. Description of the Related Art

In processing wafers in a semiconductor fabrication process, a dry etching process is carried out in which etching is performed using active gas plasma under reduced pressure to remove only a prescribed thickness of a prescribed area of a thin film formed on a wafer, one type of dry etching device that is used being an inductively coupled plasma (ICP) dry etching device. An inductively coupled plasma dry etching device is a plasma etching device that uses a plasma created by accelerating electrons in an induction field that is brought about by a high-frequency induced magnetic field. The shape of the inductively coupled plasma may be a spiral coil or a coil on flat plate.

FIG. 1A is an overall schematic sectional view of an inductively coupled plasma dry etching device of the prior art, and FIG. 1B is a sectional view of the dome. An inductively coupled plasma dry etching device of the prior art includes etching chamber 110 that houses wafer 130 that is to undergo the etching process, and ceramic dome 120 that is connected to the opening of etching chamber 110 and that is provided for generating plasma within the device. Etching chamber 110 can be maintained in an airtight state while coupled with dome 120.

Etching chamber 110 is provided with gate 111 for inserting and removing wafer 130 and gas injection port 112 for introducing the etching gas. In addition, ESC (electrostatic chuck) stage 131 made of ceramic for securing wafer 130 is provided inside etching chamber 110, while outside etching chamber 110, pressure gauge 113 and pressure controller 140 for regulating gas pressure inside the chamber and discharging gas are connected, and first high-frequency power supply 123 for supplying high-frequency current is connected to ESC stage 131.

Coil 121 is arranged in a helical form on the outside of dome 120, and coil 121 is connected to second high-frequency power supply 124.

Next, regarding the etching method that uses the inductively coupled plasma dry etching device of the prior art, wafer 130 is conveyed by way of gate 111 of etching chamber 110 onto ceramic ESC stage 131, which has the function of securing the wafer. Etching gas is directed at wafer 130, which is secured on ceramic ESC stage 131, from gas injection port 112 directly over wafer 130. The pressure inside etching chamber 110 is detected by gauge 113, and the interior of etching chamber 110 is controlled to a prescribed pressure by linking this detected pressure with an orifice of pressure controller 140, which serves as an exhaust gas outlet, and varying the orifice.

High-frequency power of 13.56 MHz is applied from second high-frequency power supply 124 to coil 121, which is arranged on the exterior surface of ceramic dome 120, high-frequency power of 13.56 MHz is next applied from first high-frequency power supply 123 to ceramic ESC stage 131, and the etching gas inside etching chamber 110 is excited to generate plasma. The excited plasma thereupon etches wafer 130 on ceramic ESC stage 131.

During the etching process, the ceramic of dome 120 is etched at the points on the inside surface of ceramic dome 120 that correspond to coil 121 as shown in FIG. 2B, while conversely, deposition 126 adheres to the points that correspond to positions where coil 121 is not present.

After the etching process is completed, first high-frequency power supply 123 and second high-frequency power supply 124 are halted and the supply of etching gas is stopped. When the etching process has been completed, wafer 130 is removed by way of gate 111 of etching chamber 110.

However, the above-described inductively coupled plasma dry etching device of the prior art has the following problems.

First, a reaction product adheres as deposition 126 to the points on the inside surface of ceramic dome 120 that correspond to positions where coil 121 is not present. If the wafer processing continues without addressing this issue, deposition 126 tends to peel off and produce particles on the wafer. As a result, not only must the interior of dome 120 be subjected to cleaning at short intervals, but particles tend to be generated, and the device availability rate drops.

Second, there is the problem that as etching of the interior surface of ceramic dome 120 progresses at points that correspond to coil 121, ceramic dome 120 is reduced and the life of dome 120 is shortened.

SUMMARY OF THE INVENTION

It is an object of the present invention to provide a dry etching device and dry etching method that tend not to produce particles, and that feature a high device availability rate and a ceramic dome having longer life.

The dry etching device of the present invention is an inductively coupled plasma dry etching device in which etching is carried out by causing an active gas plasma to act on a wafer secured inside an etching chamber under reduced pressure; the dry etching device being provided with: an etching chamber, a plasma generation means, a wafer securing means, an etching gas supply means, and a gas pressure control means. The plasma generation means includes two high-frequency power supplies that can be switched, and two coils for high-frequency power application that are connected to the two high-frequency power supplies. The two coils for high-frequency power application are each arranged in proximity to the other such that turns of each coil lie between turns of the other coil.

The plasma generation means may have a dome, and the two coils for high-frequency power application may be arranged around the outside of the dome in a helical form such that turns of each coil lie between turns of the other coil; or the plasma generation means may have a quartz plate and the two coils for high-frequency power application may be arranged on the outer surface of the quartz plate in a spiral form such that turns of each coil lie between turns of the other coil.

The dry etching method of the present invention is a method for performing dry etching by causing active gas plasma to act on a wafer that is secured inside an etching chamber under reduced pressure. In a dry etching method that employs an inductively coupled plasma dry etching device, etching is carried out by: conveying a wafer into an etching chamber and securing the wafer, introducing an etching gas into the etching chamber, regulating the interior of the etching chamber to a prescribed pressure, supplying high-frequency power from high-frequency power supplies to either of two coils for high-frequency power application belonging to a plasma generation means that are arranged in proximity to each other such that turns of each coil lie between turns of the other coil, and activating the etching gas; and further, switching the two high-frequency power supplies at a prescribed time interval so as to alternately supply high-frequency power to one of the two coils for high-frequency power application that are each connected to a respective power supply.

The interval of switching the high-frequency power supplies may be 1/nth of the time required for a prescribed etching process of one wafer, n being an even number; may be ½ the time required for a prescribed etching process of one wafer; or may be the time required for a prescribed etching process of one wafer, the high-frequency power supplies being switched with each exchange of a wafer.

The dry etching device of the present invention is an etching device that employs a plasma source which is an inductively coupled plasma method, includes two inductively coupled coils, and allows high-frequency power to be independently applied to each of the two coils.

High-frequency power is alternately applied to two coils that are arranged in helical or spiral form such that a turn of each coil lies between turns of the other coil, thereby causing etching and accumulation of deposition to occur alternately at points on the rear surface of the dome or quartz plate that correspond to the two coils. As a result, by carrying out the etching process using the two coils for the same amount of time, the amount of accumulation of deposition can be reduced and particles on the wafers that are caused by peeling off of the deposition can be suppressed despite continuous and repeated etching of a large number of wafers.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Figure 1B:
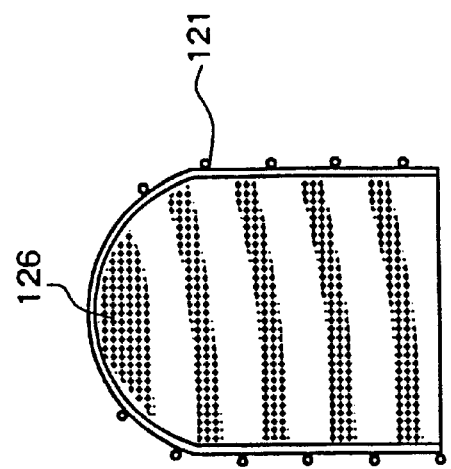
FIG. 1B is a sectional view of the dome of the inductively coupled plasma dry etching device of the example of the prior art.
Figure 1A:
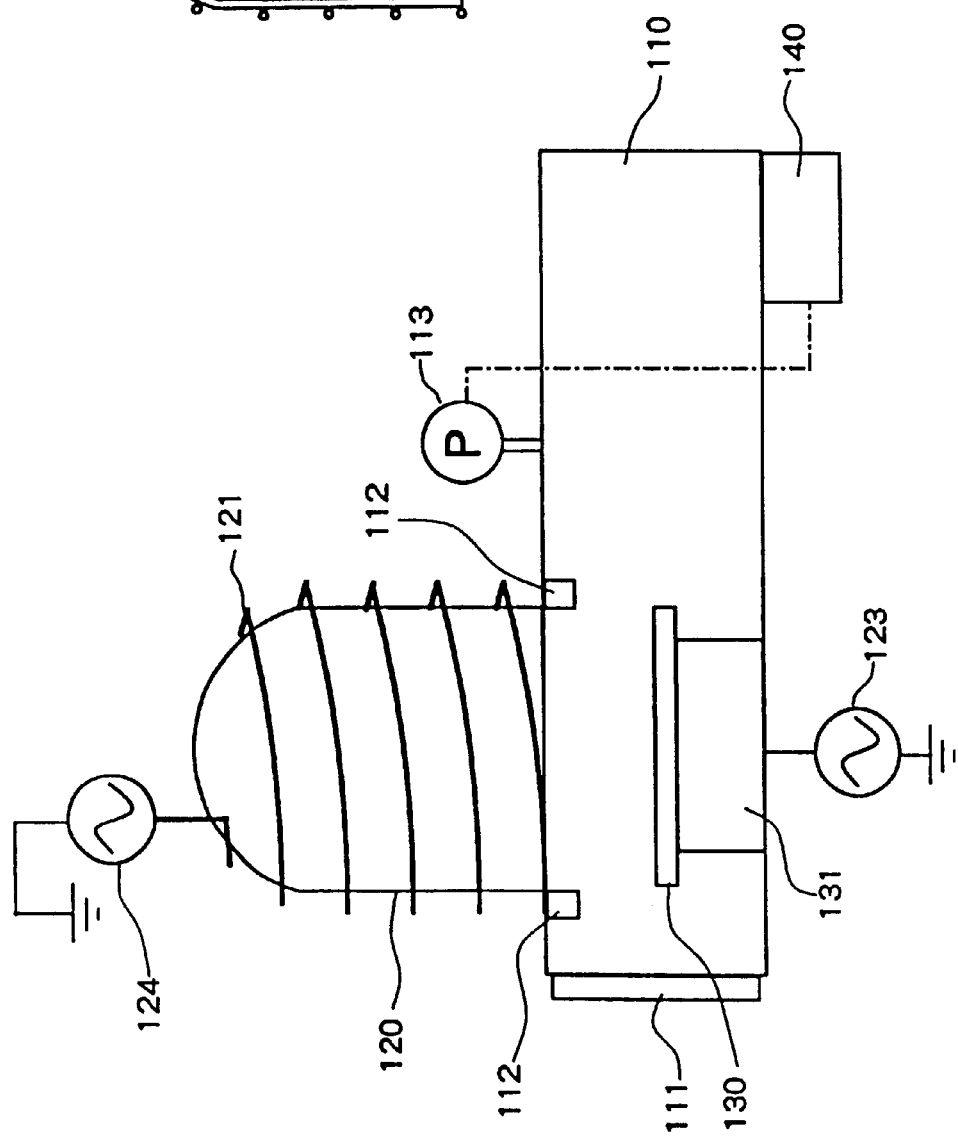
FIG. 1A is an overall sectional view and presents a schematic sectional view of the inductively coupled plasma dry etching device of an example of the prior art.
Figure 2B:
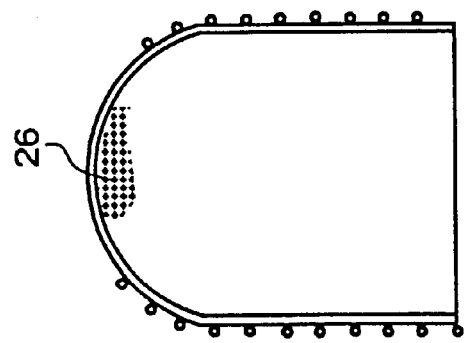
FIG. 2B is a sectional view of the dome of the inductively coupled plasma dry etching device of the first embodiment of the present invention.
Figure 2A:
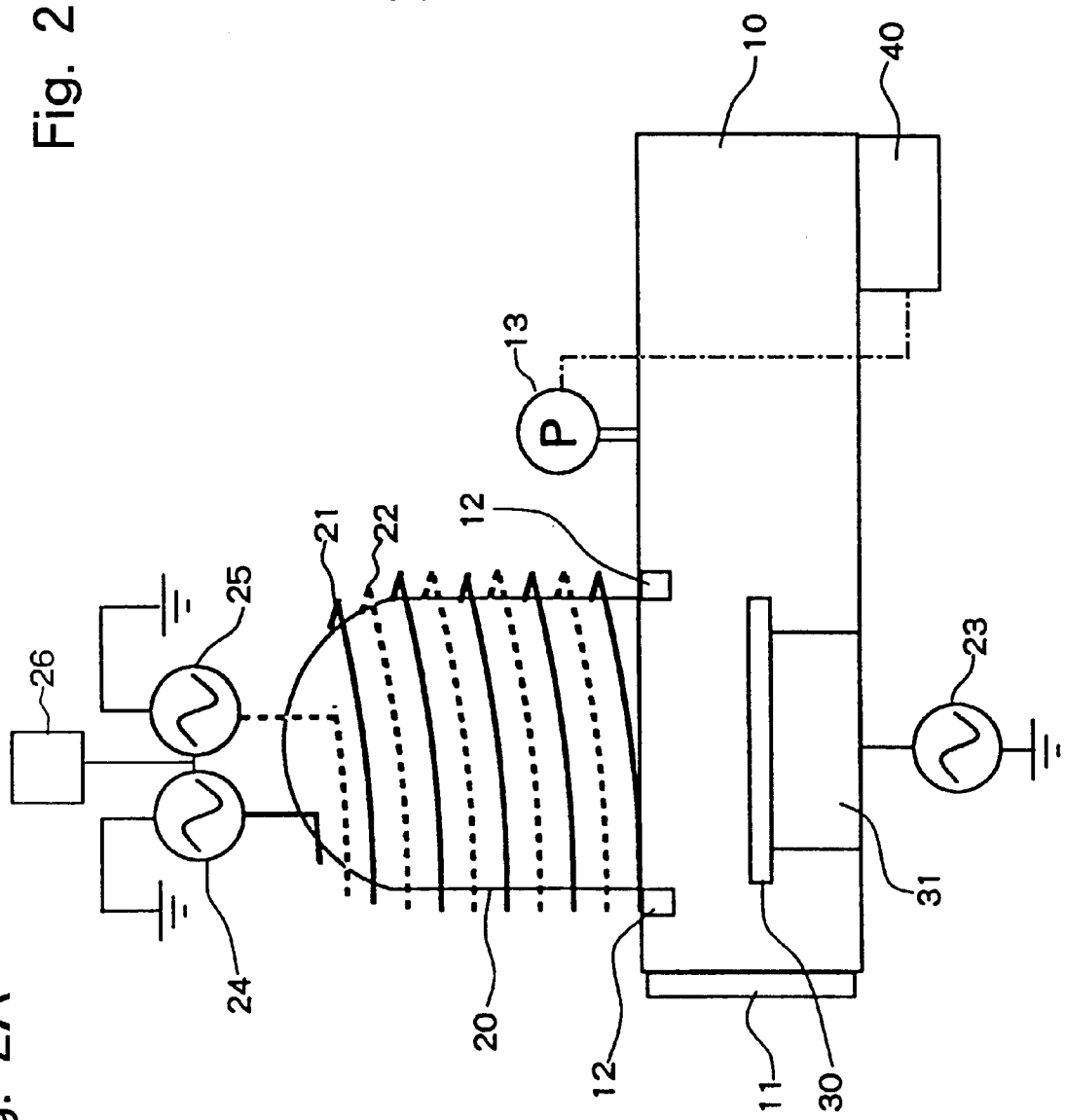
FIG. 2A is an overall sectional view and presents a schematic sectional view of the inductively coupled plasma dry etching device of the first embodiment of the present invention.

Embodiments of the dry etching device and dry etching method of the present invention are next described with reference to the accompanying figures. The first embodiment of the inductively coupled plasma dry etching device that is shown in FIG. 2A includes etching chamber 10 for housing wafer 30 that is to undergo etching, and ceramic dome 20 that is connected to an opening in etching chamber 10 and within which is generated a plasma. Etching chamber 10 can be maintained in an airtight state while coupled to dome 20.

Etching chamber 10 is provided with gate 11 for inserting and removing wafer 30 and gas injection port 12 for introducing etching gas. Ceramic ESC (electrostatic chuck) stage 31 for securing wafer 30 is provided inside etching chamber 10. On the outside of etching chamber 10, pressure gauge 13 and pressure controller 40 that both regulates gas pressure inside the chamber and discharges gas are connected, and first high-frequency power supply 23 for supplying a high-frequency current is connected to ESC stage 31.

First coil 21 and second coil 22 are arranged in helical form on the outside of dome 20 such that the turns of one coil lie between turns of the other coil. First coil 21 is connected to second high-frequency power supply 24 and second coil 22 is connected to third high-frequency power supply 25; and the supply of high-frequency power to each of the coils is switched by power supply switch 26.

Next, regarding the etching method that employs the first embodiment of the inductively coupled plasma dry etching device of the present invention, wafer 30 is conveyed by way of gate 11 of etching chamber 10 onto ceramic ESC stage 31, which has the function of securing a wafer. Etching gas is introduced from gas injection port 12 directly over the surface of wafer 30, which is secured on ceramic ESC stage 31. The pressure inside etching chamber 10 is detected by pressure gauge 13, this pressure is linked with an orifice of pressure controller 40 that serves as the exhaust gas outlet, and the interior of etching chamber 10 is controlled to a prescribed pressure by varying the orifice.

Second high-frequency power supply 24 applies high-frequency power of 13.56 MHz to first coil 21, which is arranged on the outer surface of ceramic dome 20, first high-frequency power supply 23 next applies high-frequency power of 13.56 MHz to ceramic ESC stage 31, and the etching gas inside etching chamber 10 is excited to produce a plasma. The excited plasma performs etching of wafer 30 on ceramic ESC stage 31.

During etching of wafer 30, the high-frequency power of 13.56 MHz that is being applied by second high-frequency power supply 24 to first coil 21 is cut off when half of the time required for a prescribed etching process has elapsed, whereupon high-frequency power of 13.56 MHz is applied to second coil 22, which is arranged in helical form such that turns of one coil lie between the turns of the other coil, and the etching process is continued for the remaining half of the required time without interrupting the plasma.

After completing the etching process, first high-frequency power supply 23, second high-frequency power supply 24, and third high-frequency power supply 25 are stopped, and supply of etching gas is halted. Upon completion of etching, wafer 30 is removed by way of gate 11 of etching chamber 10.

During the etching process, the ceramic of dome 20 is etched at points on the interior surface of ceramic dome 20 that correspond to coil 21 or coil 22 that is receiving high-frequency power, while conversely, deposition 26 adheres to points that correspond to places where coil 21 or coil 22 that is receiving high-frequency power is not present.

First, when high-frequency power is applied from second high-frequency power supply 24 to first coil 21 to excite the plasma inside etching chamber 10 and etch wafer 30, the etching process also causes etching of the inside surface of ceramic dome 20 at points that correspond to first coil 21, and at the same time, deposition 26 adheres to points that correspond to places where first coil 21 is not present.

Next, the application of high-frequency power to first coil 21 is halted and high-frequency power is applied to second coil 22, whereupon deposition 26 that until this point was accumulating at points on the inside surface of ceramic dome 20 that correspond to second coil 22 is etched. In parallel with this process, deposition 26 adheres to the inside surface of dome 20 that corresponds to places where second coil 22 is not present, while deposition 26 accumulates at points that correspond to first coil 21 that up to this point were being etched when high-frequency power was applied to first coil 21.

Thus, if the intervals of application of high-frequency power to first coil 21 and second coil 22 are made equal, the progression of both etching as well as accumulation of deposition 26 at positions on the inside surface of dome 20 that correspond to first coil 21 and second coil 22 can be suppressed. As shown in FIG. 2B, the accumulation of deposition 26 progresses only in the vicinity of the top surface of dome 20 where neither first coil 21 nor second coil 22 are present. As a result, particles on wafer 30 caused by the peeling off of deposition 26 can be suppressed and the frequency of cleaning of deposition 26 can also be reduced.

Explanation is next presented with reference to the figures regarding a dry etching device and dry etching method according to the second embodiment of the present invention.

Figure 3C:
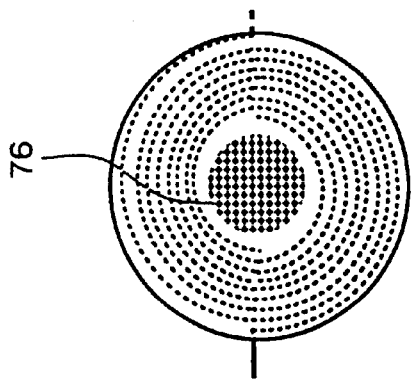
FIG. 3C is a plan view of the lower surface of the quartz plate of the inductively coupled plasma dry etching device of the second embodiment of the present invention.
Figure 3B:
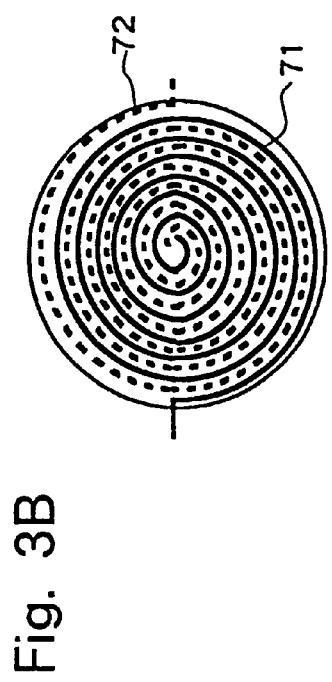
FIG. 3B is an overhead plan view of the quartz plate of the inductively coupled plasma dry etching device of the second embodiment of the present invention.
Figure 3A:
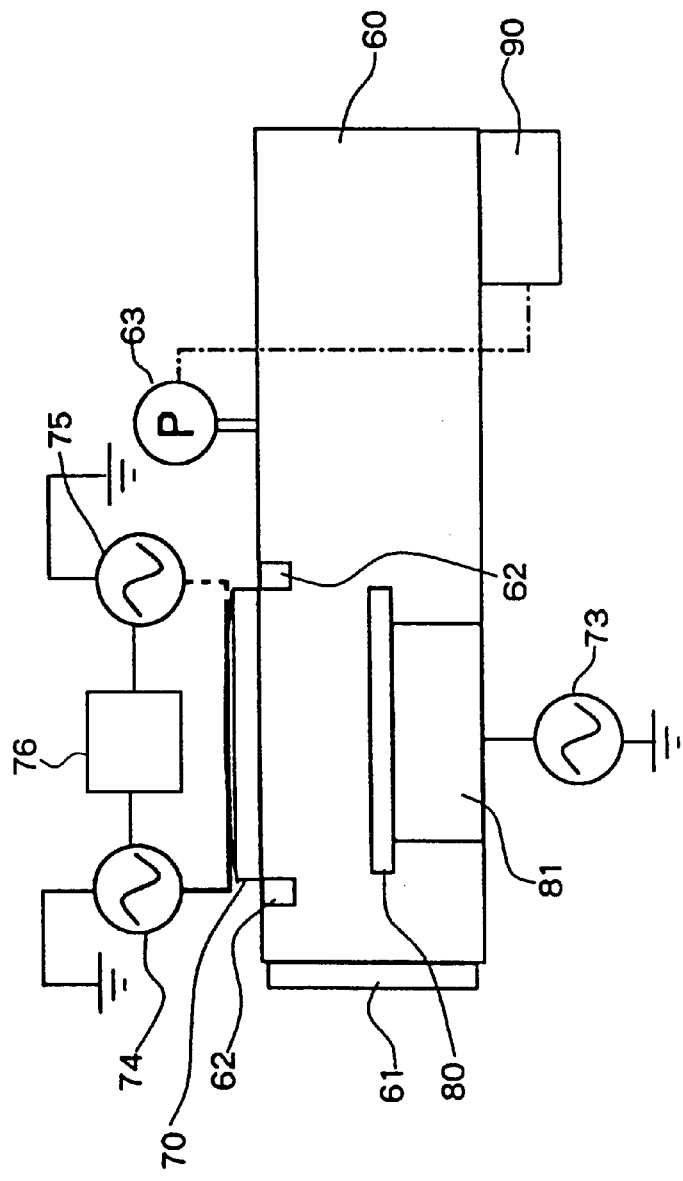
FIG. 3A is an overall sectional view and presents a schematic sectional view of the inductively coupled plasma dry etching device of the second embodiment of the present invention.

In contrast to the cylindrical coil of the first embodiment of the inductively coupled plasma dry etching device, the second embodiment of the inductively coupled plasma dry etching device shown in FIGS. 3A to 3C has a flat plate coil.

The second embodiment of the inductively coupled plasma dry etching device includes: etching chamber 60 for housing wafer 80, which is to undergo the etching process; and quartz plate 70, which is connected to an opening of etching chamber 60 and which is provided for generating plasma inside etching chamber 60. Etching chamber 60 can be maintained in an airtight state while coupled to quartz plate 70.

Etching chamber 60 is provided with gate 61 for inserting and removing wafer 80 and gas injection port 62 for introducing etching gas. Ceramic ESC stage 81 for securing wafer 80 is provided inside etching chamber 60, and outside etching chamber 60, pressure gauge 63 and gas controller 90 for regulating the gas pressure inside the chamber and discharging gas are connected, and first high-frequency power supply 73 for supplying a high-frequency power is connected to ESC stage 81.

As shown in FIG. 3B, first coil 71 and second coil 72 are arranged in spirals on the outer surface of quartz plate 70 such that turns of one coil lie between turns of the other; first coil 71 is connected to second high-frequency power supply 74, second coil 74 is connected to third high-frequency power supply 75, and the supply of high-frequency power to each of the coils is switched by power supply switch 76.

Next, regarding the etching method that uses the second embodiment of the inductively coupled plasma dry etching device of this invention, wafer 80 is conveyed by way of gate 61 of etching chamber 60 onto ceramic ESC stage 81, which has the function of securing a wafer. Etching gas is introduced from gas injection port 62 directly over wafer 80 that is secured on ceramic ESC stage 81. The pressure inside etching chamber 60 is detected by pressure gauge 63, and the interior of etching chamber 60 is controlled to a prescribed pressure by linking this detected pressure with an orifice of pressure controller 90, which serves as an exhaust gas outlet, and varying the orifice.

Second high-frequency power supply 74 applies high-frequency power of 13.56 MHz to first coil 71 arranged on the outside surface of quartz plate 70 and first high-frequency power supply 73 applies high-frequency power of 13.56 MHz to ceramic ESC stage 81 to excite the etching gas inside etching chamber 60 to generate plasma. The excited plasma etches wafer 80 that is on ceramic ESC stage 81.

During etching of wafer 80, the high-frequency power of 13.56 MHz that is applied to first coil 71 from second high-frequency power supply 74 is cut off when half of the time required for a prescribed etching process has elapsed; whereupon high-frequency power of 13.56 MHz is applied from third high-frequency power supply 75 to second coil 72, which is arranged in a spiral form with respect to first coil 71 such that turns of one coil lie between turns of the other coil; and the etching process is continued for the remaining half of the required time without interrupting the plasma.

After the etching process ends, first high-frequency power supply 73, second high-frequency power supply 74, and third high-frequency power supply 75 are stopped, and the supply of etching gas is halted. When the etching process has been completed, wafer 80 is removed by way of gate 61 of etching chamber 60.

During the etching process, the quartz of quartz plate 70 is etched at the points on the lower surface of quartz plate 70 that correspond to coil 71 or coil 72 to which high-frequency power is applied, while conversely, deposition 76 adheres to points that correspond to positions where coil 71 or coil 72 to which high-frequency power is applied is not present.

At first, while the plasma inside etching chamber 60 is excited and etching of wafer 80 performed by applying high-frequency power to first coil 71 from second high-frequency power supply 74, the etching process causes points on the lower surface of quartz plate 70 that correspond to coil 71 to be etched and deposition 76 to adhere to points that correspond to positions where first coil 71 is not present.

Then, by halting the application of high-frequency power to first coil 71 and applying high-frequency power to second coil 72, deposition 76 that until just before had accumulated at points on the lower surface of quartz plate 70 that correspond to second coil 72 now undergoes etching. In parallel with this process, deposition 76 adheres to the lower surface of quartz plate 70 that corresponds to positions where second coil 72 is not present. As a result, deposition 76 accumulates at points that correspond to first coil 71 that until just before were being etched when high-frequency power was applied to first coil 71.

Thus, if the intervals of application of high-frequency power to first coil 71 and second coil 72 are made equal, the progression of etching as well as accumulation of deposition 76 at positions on the lower surface of quartz plate 70 that correspond to first coil 71 and second coil 72 can both be suppressed. As shown in FIG. 3C, the accumulation of deposition 76 progresses only in the central portion of quartz plate 70 where neither first coil 71 nor second coil 72 are present. As a result, particles on wafer 80 caused by the peeling off of deposition 76 can be suppressed and the frequency of cleaning of deposition 76 can also be reduced.

Next, regarding the dry etching method of the third embodiment of the present invention, the dry etching method of the third embodiment of this invention can be applied to the dry etching device of either the first embodiment or second embodiment, and further explanation of the construction of the dry etching device is therefore here omitted.

Since this dry etching method is basically the same as the first embodiment and second embodiment, only the points of difference will be explained. In the dry etching methods of the first embodiment and the second embodiment, the high-frequency power of 13.56 MHz that is applied from the second high-frequency power supply to the first coil is cut when half the time required for a prescribed etching process of one wafer has elapsed. At this point, high-frequency power of 13.56 MHz is applied from the third high-frequency power supply to the second coil, which is arranged in a helix or spiral with respect to the first coil such that turns of one coil lie between turns of the other coil, and the etching process is continued for the remaining half of the required time without interrupting the plasma. In the third embodiment, however, when carrying out the wafer etching process, a wafer that has started to undergo processing is etched using first coil 21 or 71, and the next wafer to be conveyed is etched using second coil 22 or 72.

Wafers having an odd-numbered ordinal rank thus undergo etching using first coil 21 or 71, and wafers having an even-numbered ordinal rank undergo etching using second coil 22 or 72. When carrying out processing for a considerable number of wafers, the time interval of application of high-frequency power to first coil 21 or 71 is substantially equal to that of second coil 22 or 72, and the same effect can be obtained as in the first embodiment or the second embodiment.

Next, regarding the dry etching method of the fourth embodiment of the present invention, the dry etching method of the fourth embodiment of this invention can be applied to the dry etching device of either the first embodiment or second embodiment, and explanation of the construction of the dry etching device is therefore here omitted.

Since this dry etching method is basically the same as the first embodiment and second embodiment, only the points of difference will be explained. In the dry etching methods of the first embodiment and the second embodiment, the high-frequency power of 13.56 MHz that is applied from the second high-frequency power supply to the first coil is cut when half the time required for a prescribed etching process of one wafer has elapsed. At this point, high-frequency power of 13.56 MHz is applied from the third high-frequency power supply to the second coil, which is arranged in a helix or spiral with respect to the first coil such that turns of one coil lie between turns of the other coil, and the etching process is continued for the remaining half of the required time without interrupting the plasma. In the fourth embodiment, however, when carrying out the wafer etching process, high-frequency power is alternately applied to first coil 21 or 71 and second coil 22 or 72 at an interval of time that is sufficiently shorter than the time required for a prescribed etching process, for example, a time interval of 1/10 of the time required for a prescribed etching process. The interval of application of high-frequency power to first coil 21 or 71 is substantially equal to that for second coil 22 or 72, whereby the same effect can be obtained as in the first embodiment or the second embodiment.

As explained in the foregoing description, in the present invention high-frequency power is alternately applied to two coils that are arranged in a helical or spiral form such that turns of one coil lie between turns of the other, and as a result, etching and the accumulation of deposition occur alternately at the points on the lower surface of a dome or quartz plate that correspond to the two coils. By carrying out etching such that the two coils are used for equal time periods, the amount of accumulation of deposition can be reduced despite continuous and repeated etching of a large number of wafers, and the incidence of particles on the wafers due to peeling off of the deposition can be suppressed.

In addition, since the frequency of cleaning can be reduced, the device availability rate can be improved.

Finally, since the progression of etching of the dome or quartz plate is curtailed, the life of the dome or quartz plate can be extended.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. An inductively coupled plasma dry etching device in which etching is carried out by causing an active gas plasma to act on a wafer secured inside an etching chamber under reduced pressure; wherein:

said dry etching device comprises:
an etching chamber,
a plasma generation means;
a wafer securing means;
an etching gas supply means; and
a gas pressure control means;
said plasma generation means includes:
two high-frequency power supplies that can be switched;
two coils for high-frequency power application that are each connected to a respective one of said two high-frequency power supplies; and
a switch for switching two high-frequency power supplies at a prescribed time interval;
and said two coils for high-frequency power application are each arranged in proximity to the other such that turns of each coil lie between turns of the other coil.

2. An inductively coupled plasma dry etching device according to claim 1 wherein said plasma generation means comprises a dome, and said two coils for high-frequency power application are arranged around the outside of said dome in a helical form such that turns of each coil lie between turns of the other coil.

3. An inductively coupled plasma dry etching device according to claim 1 wherein said plasma generation means comprises a quartz plate, and said two coils for high-frequency power application are arranged on the outer surface of said quartz plate in a flat spiral form such that turns of each coil lie between turns of the other coil.

* * * * *